United States Patent
Vandel (10) Patent No.: US 9,257,997 B2
(45) Date of Patent: Feb. 9, 2016

(54) ANALOG LOOP FILTER SYSTEMS, APPARATUS, AND METHODS

(75) Inventor: Eric Vandel, Concise (CH)

(73) Assignee: SEMTECH CORPORATION, Camarillo, CA (US)

(*) Notice: Subject to any disclaimer, the term of this patent is extended or adjusted under 35 U.S.C. 154(b) by 0 days.

(21) Appl. No.: 13/450,709

(22) Filed: Apr. 19, 2012

(65) Prior Publication Data
US 2013/0278329 A1    Oct. 24, 2013

(51) Int. Cl.
- *H03L 7/06* (2006.01)
- *H03L 7/081* (2006.01)
- *H03L 7/099* (2006.01)
- *H03H 11/48* (2006.01)

(52) U.S. Cl.
CPC .............. *H03L 7/0816* (2013.01); *H03L 7/099* (2013.01); *H03H 11/481* (2013.01)

(58) Field of Classification Search
CPC ........................... H03L 7/0816; H03H 11/481
USPC .......... 327/100, 551–559, 147–161; 331/176, 331/17, 34, 36 R
See application file for complete search history.

(56) References Cited

U.S. PATENT DOCUMENTS

| | | | |
|---|---|---|---|
| 6,975,176 B2* | 12/2005 | Loke et al. | 331/177 V |
| 7,116,183 B2* | 10/2006 | Wu | 331/176 |
| 7,463,098 B2* | 12/2008 | Baird et al. | 331/16 |
| 2006/0255864 A1 | 11/2006 | Vandel | |
| 2009/0115537 A1 | 5/2009 | Ramaswamy et al. | |

\* cited by examiner

*Primary Examiner* — Dinh Le
(74) *Attorney, Agent, or Firm* — Robert D. Atkins; Patent Law Group: Atkins and Associates, P.C.

(57) ABSTRACT

Described herein is a distributed analog loop filter that can be employed in a phase locked loop or a delay locked loop. A circuit block of the distributed analog loop filter includes at least two parallel equivalent circuit elements. The parallel equivalent circuit elements each have an input line. The input lines for each of the parallel equivalent circuit elements are activated sequentially, one after the other. The parallel equivalent circuit elements have sequentially produced outputs that are also activated sequentially, one after another. The parallel equivalent circuit elements extend the tuning range of distributed analog filter while reducing noise associated with the distributed analog filter.

23 Claims, 10 Drawing Sheets

ANALOG LOOP FILTER SYSTEMS, APPARATUS, AND METHODS

TECHNICAL FIELD

This disclosure generally relates generally to distributed analog loop filters, and more specifically to noise reduction in distributed analog loop filters.

BACKGROUND

Analog loop filters are utilized to generate signals that are in a precise relationship with a given input signal. Analog loop filters can be used in many applications, including phase locked loops and delay locked loops. Phase locked loops generate output signals that are in a determined phase and frequency relationship with an input signal, while delay locked loops regulate the phase of an input clock signal.

In a phase locked loop, regulation of the phase and frequency is accomplished through a stabilized reference oscillator, such as a voltage controlled oscillator. Delay locked loops, in contrast, do not employ reference oscillators. Instead, delay locked loops employ delay lines in place of reference oscillators to change the phase of a clock signal. Phase locked loops are employed, for example, in radio, telecommunications, computers and other electronic applications for applications like signal recovery, frequency synthesis, or pulse distribution. Delay locked loops are employed, for example, in integrated circuits to change the phase of a clock signal or for clock recovery.

SUMMARY

The following presents a simplified summary to provide a basic understanding of some aspects of the subject disclosure. This summary is not an extensive overview of the disclosed subject matter. It is not intended to identify key or critical elements of the disclosed subject matter, nor is it intended to delineate the scope of the subject disclosure or the claims. Its sole purpose is to present some concepts of the disclosed subject matter in a simplified form as a prelude to the more detailed description presented later.

In an embodiment of the subject disclosure, described is a distributed analog loop filter that achieves less noise over a wider tuning range and better supply immunity than traditional analog loop filters. The distributed analog loop filter can be employed within a phase locked loop (as a voltage controlled oscillator) or a delay locked loop (as a distributed delay line).

The distributed analog loop filter, according to an embodiment of the subject disclosure, is employed within a voltage controlled oscillator. The voltage controlled oscillator includes a variable capacitor made of a number of progressively switched capacitors. The number of progressively switched capacitors (N) is greater than or equal to two. Each of the progressively switched capacitors has its own individual control line.

In the variable capacitor, each of the progressively switched capacitors are activated sequentially and sequentially produce outputs. The variable capacitor made of the parallel equivalent progressively switched capacitors described herein extends the tuning range of the voltage controlled oscillator, while also reducing the noise associated with the voltage controlled oscillator. The variable capacitor made of the parallel equivalent progressively switched capacitors can also increase the quality factor (Q) if the voltage controlled oscillator (e.g., a voltage controlled oscillator tank quality factor if an LC-VCO is present).

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the embodiments of the subject disclosure. One skilled in the relevant art will recognize, however, that the embodiments described herein can be practiced without one or more of the specific details, or with other methods, components, materials, etc. In other instances, well-known structures, materials, or operations are not shown or described in detail to avoid obscuring certain aspects.

According to an aspect of the subject disclosure, described herein is a distributed analog loop filter that can be used in a phase locked loop, a delay locked loop, or other analog loops. The distributed analog loop filter has a number of parallel equivalent circuit elements that are sequentially (one after another) activated to produce outputs in sequence. The parallel equivalent circuit elements in the distributed analog loop filter improve characteristics, such as noise, tuning range, supply immunity, and the like compared to traditional analog loop filters.

Figure 1:
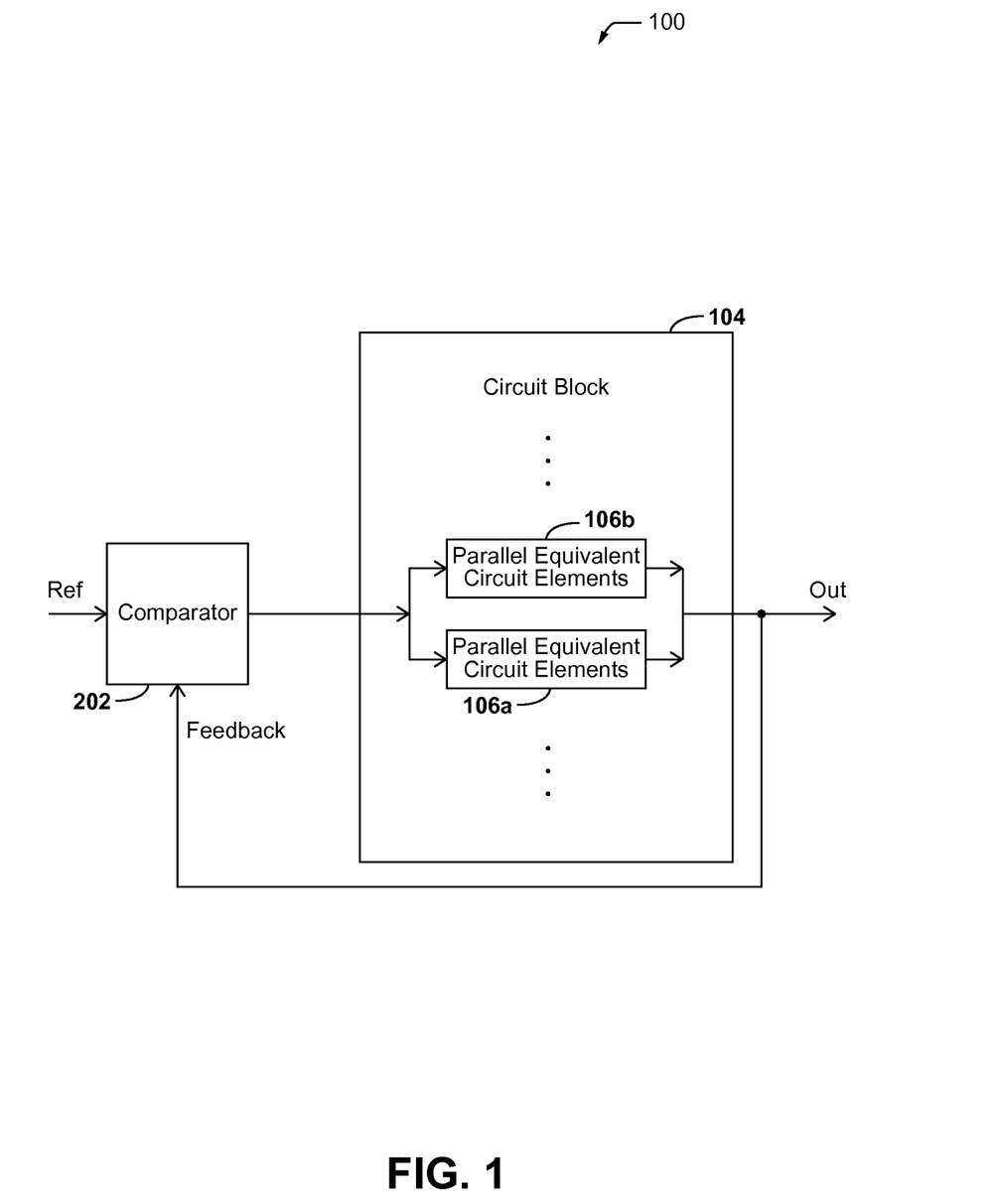
FIG. 1 is a schematic illustration of an analog loop filter, according to an embodiment of the subject disclosure.

A schematic illustration of a distributed analog loop filter 100, according to an embodiment of the subject disclosure, is shown in FIG. 1. The distributed analog loop filter 100 receives an input signal (Ref) and produces an output signal (Out) that is fed back (Feedback) for correction and regulation of the output signal.

The distributed analog loop filter 100 includes a comparator 102. The word "comparator" is used herein to describe any circuit element that can generate one or more corrected signals based on a comparison between an input signal and a feedback signal. A signal produced by the comparator 102 is fed to a circuit block 104. The circuit block includes parallel equivalent circuit elements 106a, 106b. Although just two circuit elements 106a and 106b are illustrated for simplicity of illustration and explanation, it will be understood that analog loop filter 100 can have any number of parallel equivalent circuit elements that is at least two.

Within the circuit block 104, the signal from the comparator 102 is sequentially input to the parallel equivalent circuit elements 106a, 106b, one after the other. The parallel equivalent circuit elements 106a, 106b sequentially produce outputs according to a proportionality constant in response to the input. The outputs of the parallel equivalent circuit elements 106a, 106b are collectively referred to as the output signal (Out). The outputs of the parallel equivalent circuit elements 106a, 106b are fed back to the comparator as a feedback signal (Feedback). The comparator 102 (or another circuit element within the feedback path) establishes a ratio between a characteristic of the input signal (In) and the same characteristic of the output signal (Out). The ratio is used by the comparator 102 to lock the frequency of subsequent output signals (Out).

Figure 2:
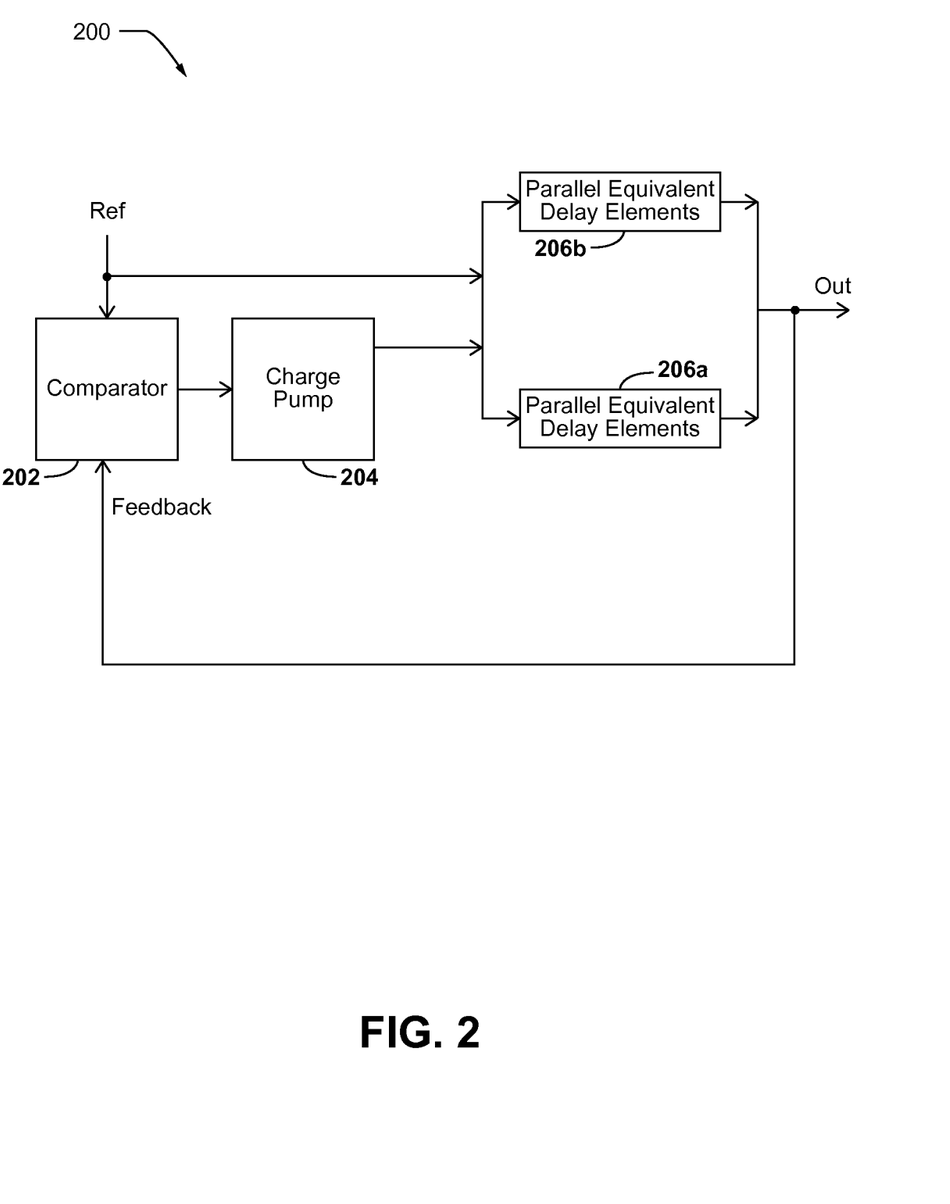
FIG. 2 is a schematic illustration of a delay locked loop, according to an embodiment of the subject disclosure.
Figure 3:
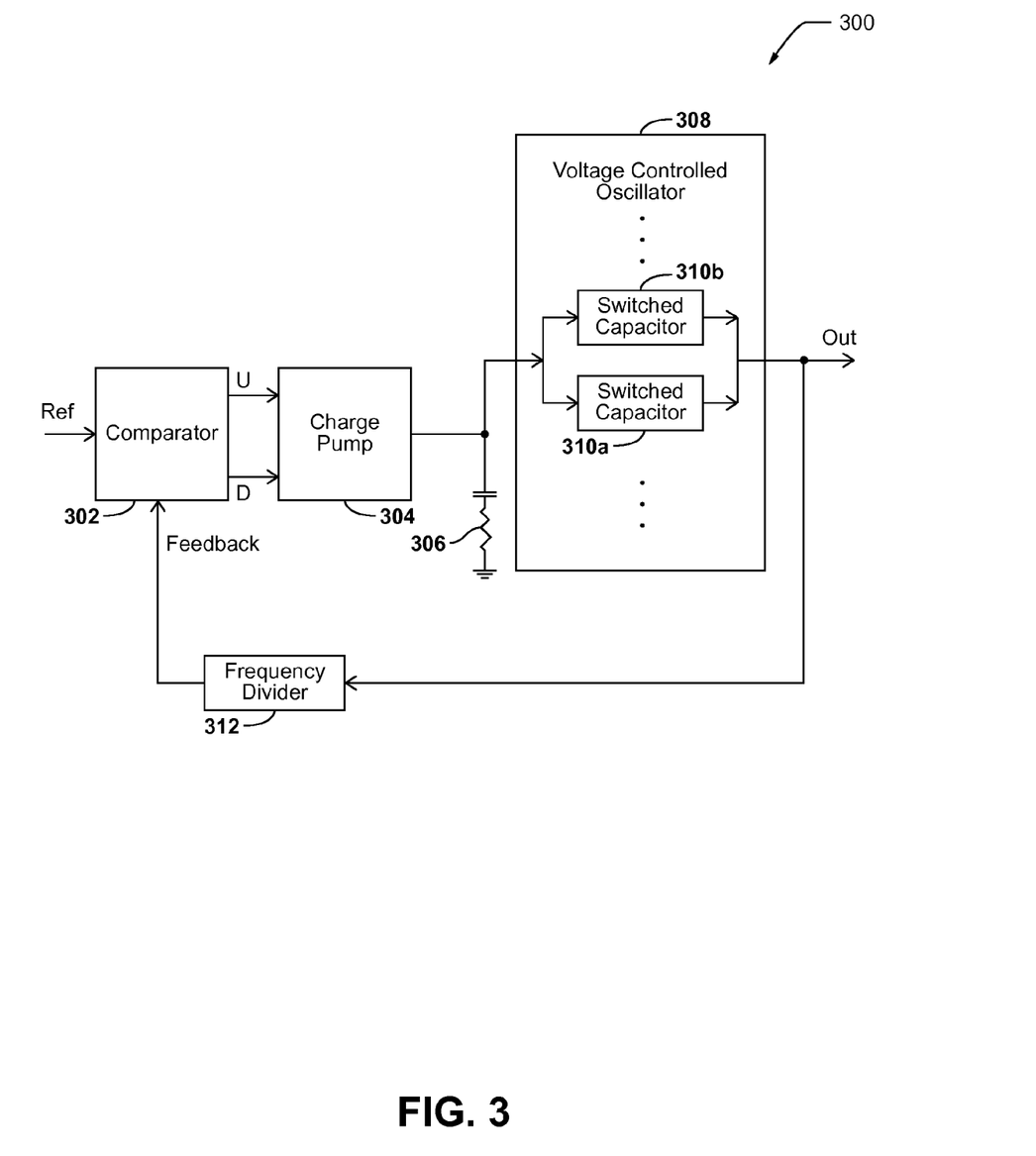
FIG. 3 is a schematic illustration of a phase locked loop, according to an embodiment of the subject disclosure.

The distributed analog filter 100 can be utilized in different applications, such as a phase locked loop, a delay locked loop, or any other analog loop. An implementation of the distributed analog loop filter 100 in a delay locked loop is shown in FIG. 2. In FIG. 3, illustrated is an implementation of the distributed analog loop filter 100 in a phase locked loop. It will be understood that the delay locked loop and phase locked loop are just two examples of potential implementations of the distributed analog loop filter 100 and that the distributed analog loop filter 100 can be implemented in any analog loop.

A delay locked loop 200, according to an embodiment of the subject disclosure, is illustrated in FIG. 2. Delay locked loop 200 generates an output signal (Out) a predetermined delay from an input reference signal (Ref). The input reference signal (Ref) is a reference clock input, while the output signal (Out) is a clock output.

The delay locked loop 200 includes a comparator 202 that receives the input reference signal (Ref). The input reference signal (Ref) corresponds to the signal that is to be corrected by the delay locked loop 200. The comparator 202 also receives a feedback signal (Feedback) as an input. The comparator 202 compares the input reference signal (Ref) to the feedback signal (Feedback) and determines if the output signal (Out) is ahead of the input reference signal (Ref) or behind the input reference signal (Ref) in phase. Based on the determination, the comparator 202 generates an error signal, which drives a charge pump 204 to generate a correction signal.

The correction signal from charge pump 204 and the input reference signal (Ref) are both sent through parallel equivalent delay lines with parallel equivalent delay elements 206a, 206b. Although just two delay lines and corresponding delay elements 206a, 206b are illustrated for simplicity of illustration and explanation, it will be understood that delay locked loop 200 can have any number of parallel equivalent delay lines and corresponding delay elements that is at least two.

The parallel equivalent delay lines with parallel equivalent delay elements 206a, 206b sequentially receive inputs of the input reference signal (Ref) and the correction signal from the charge pump 204. The parallel equivalent delay elements 206a, 206b sequentially, one after another, correct the input reference signal (Ref) according to the correction signal from the charge pump 204. The parallel equivalent delay lines with parallel equivalent delay elements 206a, 206b sequentially produce an output signal (Out) that is the reference signal (Ref) delayed by the correction signal from the charge pump 204. The output signal is fed back as a feedback signal (Feedback) to the comparator 202 to facilitate correction of the input reference signal (Ref).

The parallel equivalent delay lines with parallel equivalent delay elements 206a, 206b lead to a reduction in equivalent gain of the delay lock loop 200 and an improvement with regard to noise compared to a delay lock loop with a single delay line and delay element. The parallel equivalent delay elements 206a, 206b have a sensitivity of a corresponding input reduced by a factor of N, the number of parallel equivalent delay elements 206a, 206b (N=2 in FIG. 2, but can be any number greater than or equal to 2).

Similarly to a delay locked loop 200, a phase locked loop 300 sees a reduction in equivalent gain and an improvement with regard to noise when parallel equivalent circuit elements are utilized. A phase locked loop 300, according to an embodiment of the subject disclosure, is illustrated in FIG. 3. A phase locked loop 300, similar to the delay locked loop 200, generates output signals (Out) that have a precise relationship with regard to phase and frequency to an input reference signal (Ref).

The phase locked loop 300 includes a comparator 302 that receives the input reference signal (Ref). The comparator 302 measures the phase difference and the frequency difference between the input reference signal (Ref) and a feedback signal (Feedback) corresponding to an output signal (Out). The comparator 302 generates two signals (U and D) that allow a charge pump 304 to generate an error signal, which is filtered through a low pass filter 306. The filtered error signal is used to drive a voltage controlled oscillator 308.

A voltage controlled oscillator (such as a LC-voltage controlled oscillator) employs a MOS or junction varactor or variable capacitor to provide capacitance to the voltage controlled oscillator. A voltage applied to the MOS or junction varactor or the variable capacitor provides the frequency. For high-frequency operation, the quality factor (Q) of a MOS or junction varactor can be rather low and significantly degrade the overall quality factor (Q) of the voltage controlled oscillator.

To prevent the degradation of the overall quality factor (Q), voltage controlled oscillator 308 employs a variable capacitor made of parallel equivalent progressively switched capacitors to provide capacitance. Although just two progressively switched capacitors 310a, 310b are illustrated for simplicity of illustration and explanation, it will be understood that the variable capacitor of the phase locked loop 300 can have any number of progressively switched capacitors that is at least two.

The progressively switched capacitors 310a, 310b are fed by separate corresponding control lines that are sequentially activated, one at a time. In response to activation, the progressively switched capacitors 310a, 310b produce sequentially produced outputs, one after the other. The output signal (Out)

is based on a proportionality constant Kvco (Kvco is also referred to as a tuning factor; when used herein, Kvco is called a proportionality constant and a tuning factor interchangeably). Since the progressively switched capacitors 310a, 310b produce sequentially produced outputs corresponding to sequential activation, the proportionality constant Kvco is scaled down by the number of progressively switched capacitors (N=2 in FIG. 3, but can be any number greater than or equal to 2). The output signal (Output) is fed back through a frequency divider 312, and a feedback signal (Feedback) is input to the comparator 302 to establish a ratio between the output frequency and the input reference frequency, to which the output frequency is locked.

Figure 4:
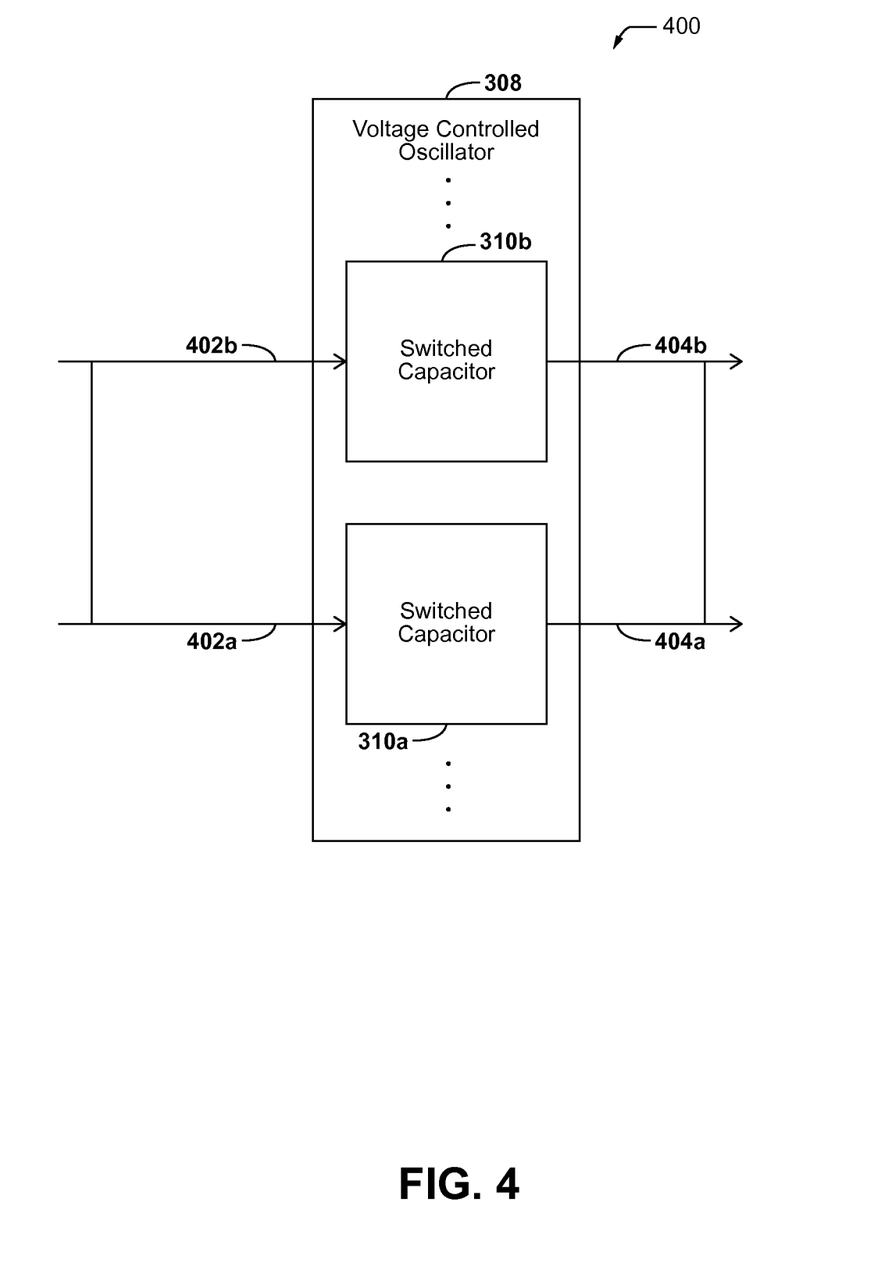
FIG. 4 is a schematic illustration of a voltage controlled oscillator that can be utilized as part of a phase locked loop circuit, according to an embodiment of the subject disclosure.

A schematic illustration 400 of the voltage controlled oscillator 308 of phase locked loop circuit 300 is shown in FIG. 4. The voltage controlled oscillator 308 can be, for example, a harmonic oscillator that generates a sinusoidal waveform, such as an LC-oscillator, where part of the resonance frequency of the oscillator is provided by a varactor. The voltage controlled oscillator 308 includes a variable capacitor made up of progressively switched capacitors 310a, 310b. Although just two progressively switched capacitors 310a, 310b are illustrated for simplicity of illustration and explanation, it will be understood that phase locked loop 300 can have any number of progressively switched capacitors that is at least two.

The variable capacitor made of progressively switched capacitors 310a, 310b are used in place of a MOS or junction varactor to counteract a low quality factor (Q) for high-frequency operation. Each of the progressively switched capacitors 310a, 310b corresponds to a control line 402a, 402b, such that the number of control lines 402a, 402b is multiplied by the number of progressively switched capacitors 310a, 310b. Each of the progressively switched capacitors 310a, 310b produces an output 404a, 404b sequentially in response to activation.

Quality factor (Q) is a dimensionless parameter that describes how under-damped the voltage controlled oscillator 308 is. A higher quality factor (Q) indicates a lower rate of energy loss relative to the stored energy of the oscillator, so that the oscillations die out more slowly. Accordingly, oscillators with a high quality factor (Q) have low damping so that they ring longer.

In circuits with a MOS or junction varactor with a single input and output, the quality factor (Q) can be quite low for high frequencies. In voltage controlled oscillator 308 with a variable capacitor made of progressively switched capacitors 310a, 310b, the overall quality factor (Q) is higher. Even if the quality factor (Q) of one of the progressively switched capacitors 310a, 310b drops at a particular biasing point, the overall characteristic of the total varactor made up of the progressively switched capacitors 310a, 310b always stay good because only one of the progressively switched capacitors 310a, 310b is operating in the less favorable region of operation.

In addition to quality factor (Q), tuning range, tuning gain and phase noise are also important design considerations for voltage controlled oscillator 308. Phase noise depends on the noise present in the input and the tuning gain, as well as the quality factor (Q). A low tuning gain corresponds to a low phase noise. A high quality factor (Q) also corresponds to low phase noise.

The voltage controlled oscillator 308 with a variable capacitor made of progressively switched capacitors 310a, 310b has improved noise characteristics compared to traditional voltage controlled oscillators. Voltage controlled oscillator 308 exhibits a higher quality factor (Q) and a lower tuning gain than traditional voltage controlled oscillators. The equivalent proportionality constant Kvco of voltage controlled oscillator 308 is divided by the number of parallel outputs 404, 404b. The number of sequentially produced outputs (N) can be any integer number greater than or equal to 2, so that with N outputs, a noise improvement on the order of 10 log N decibels can be expected.

Figure 5:
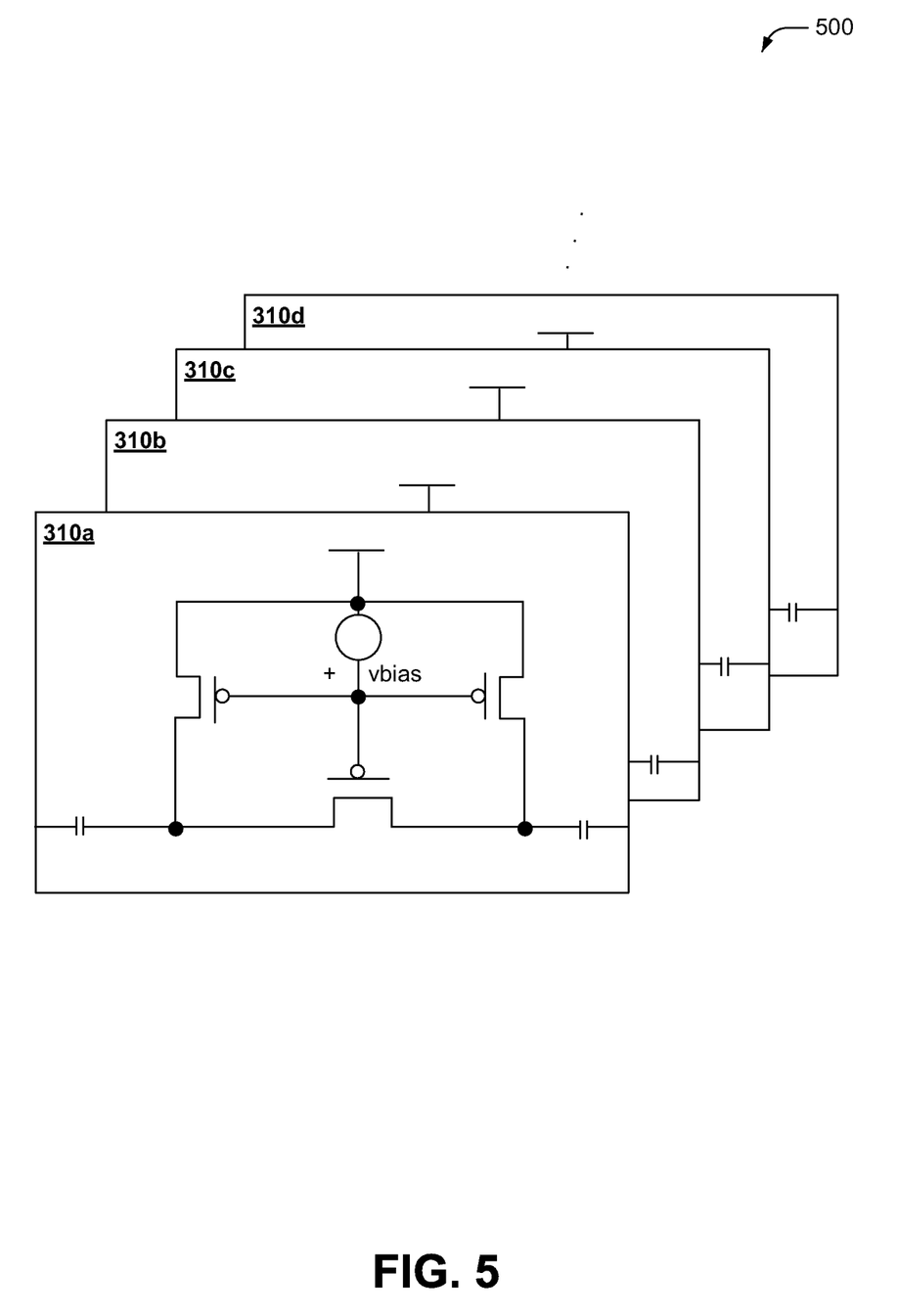
FIG. 5 is a schematic illustration of variable capacitor made of parallel equivalent progressively switched capacitors that can be utilized in a voltage controlled oscillator, according to an embodiment of the subject disclosure.

Referring now to FIG. 5, illustrated is a schematic diagram 500 of a variable capacitor made of progressively switched capacitors 310a, 310b, 310c, 310d that can be utilized as a varactor in a voltage controlled oscillator, according to an embodiment of the subject disclosure. Although four progressively switched capacitors 310a, 310b, 310c, 310d are illustrated herein, it will be understood that any number of progressively switched capacitors greater than or equal to two can be utilized. Although PMOS switches are illustrated in FIG. 5, it will be understood that any kind of switches can be used. Examples of switches include, but are not limited to, PMOS switches, NMOS switches, pin diode switches, bipolar junction transistor switches, and the like.

The variable capacitor progressively switched capacitors 310a, 310b, 310c, 310d increase the quality factor (Q) of a voltage controlled oscillator. The progressively switched capacitors 310a, 310b, 310c, 310d decrease the proportionality constant Kvco by a factor of 1/N.

By decreasing the proportionality constant Kvco, the progressively switched capacitors 310a, 310b, 310c, 310d facilitate an increase in tuning range, while decreasing the tuning gain. The progressively switched capacitors 310a, 310b, 310c, 310d also improve the noise characteristics of the voltage controlled oscillator due to a reduction of the proportionality constant Kvco by a factor of the number of parallel outputs without significantly contributing to consumption.

Figure 6:
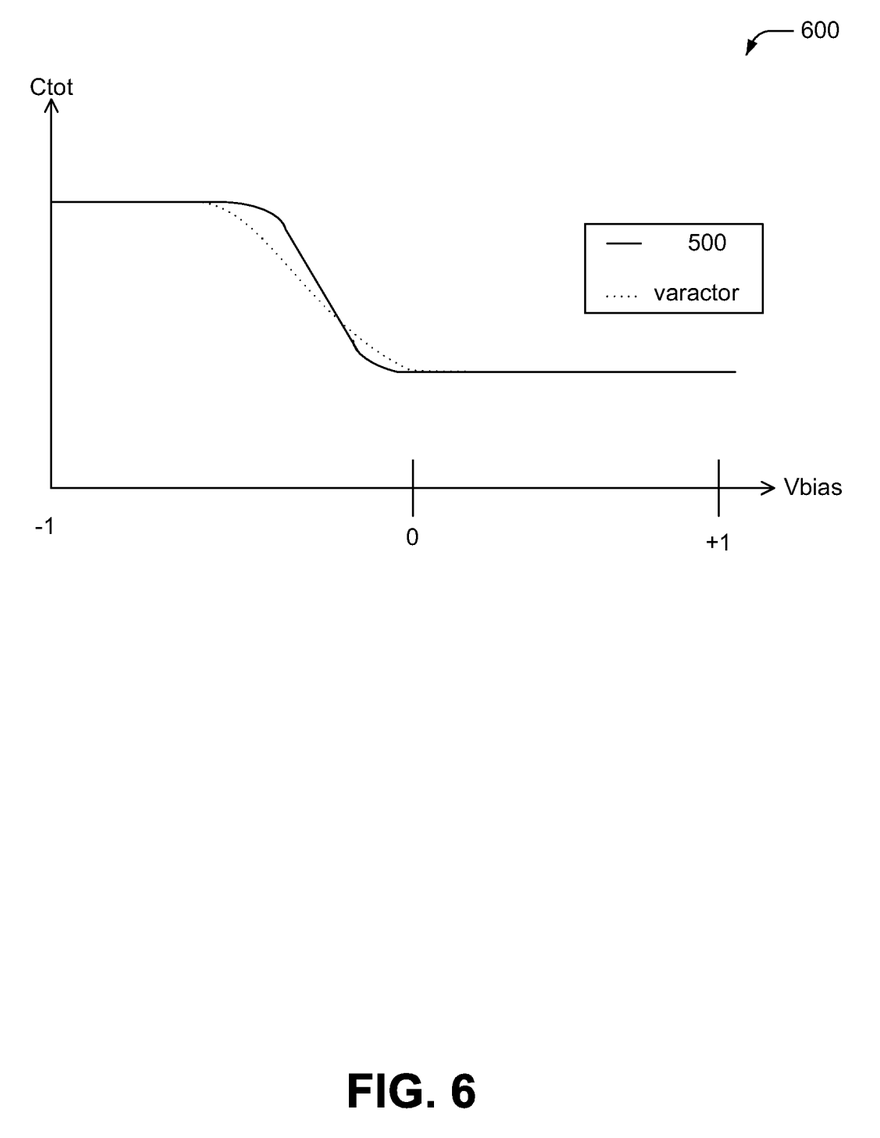
FIG. 6 is a graph comparing the total capacitance that can be achieved by the variable capacitor made of parallel equivalent progressively switched capacitors of FIG. 5 to the total capacitance that can be achieved by a varactor.

FIG. 6 is a graph comparing the variable capacitor of progressively switched capacitors (solid line) shown in FIG. 5 (500) to a traditional MOS or junction varactor (dashed line). FIG. 6 is a graph 600 comparing the total capacitance that can be achieved by the progressively switched capacitors of FIG. 5 (500) to the total capacitance that can be achieved by a varactor. As shown in FIG. 6, the varactor and the progressively switched capacitors of FIG. 5 (500) exhibit similar total capacitance (Ctot) for a range of bias voltages (Vbias).

The progressively switched capacitors of FIG. 5 (500) have a large improvement over a traditional varactor with regard to noise. Having outputs for each progressively switched capacitor reduces the equivalent proportionality constant Kvco by a factor of 1/N, the number of progressively switched capacitors, which is greater than or equal to 2.

For the same equivalent tuning range, the traditional varactor has a single path generating noise in loaded by a capacitor of value Ctot and driving a voltage controlled oscillator with a tuning factor Kvco. In contrast, the varactor with N progressively switched capacitors, where N is greater than or equal to 2, with the same equivalent tuning range and total capacitance (Ctot), drives the voltage controlled oscillator with a tuning factor of Kvco/N. The reduction in tuning factor by a factor of 1/N and a reduction in gain by a factor of 1/N results in a noise reduction on the order of 10 log N decibels for the same tuning range.

For example, with 7 outputs (N=7), the seven progressively switched capacitors theoretically exhibit a 10 log 7 or 8.4 decibel noise improvement. In reality, the distributed outputs slightly overlap each other, so the noise improvement is slightly lower. Supply rejection benefits from the same factor.

FIGS. 7, 8, 9 and 10 show methods illustrated as flow diagrams. For simplicity of explanation, the methods are depicted and described as series of acts. However, the methods are not limited by the acts illustrated and by the order of acts. For example, acts can occur in various orders and/or concurrently, and with other acts not presented and described herein. Furthermore, not all illustrated acts may be required to implement the methods. Additionally, it should be further appreciated that the methods can be implemented on an article of manufacture (e.g., an analog loop filter) to facilitate transporting and transferring the methods.

Figure 7:
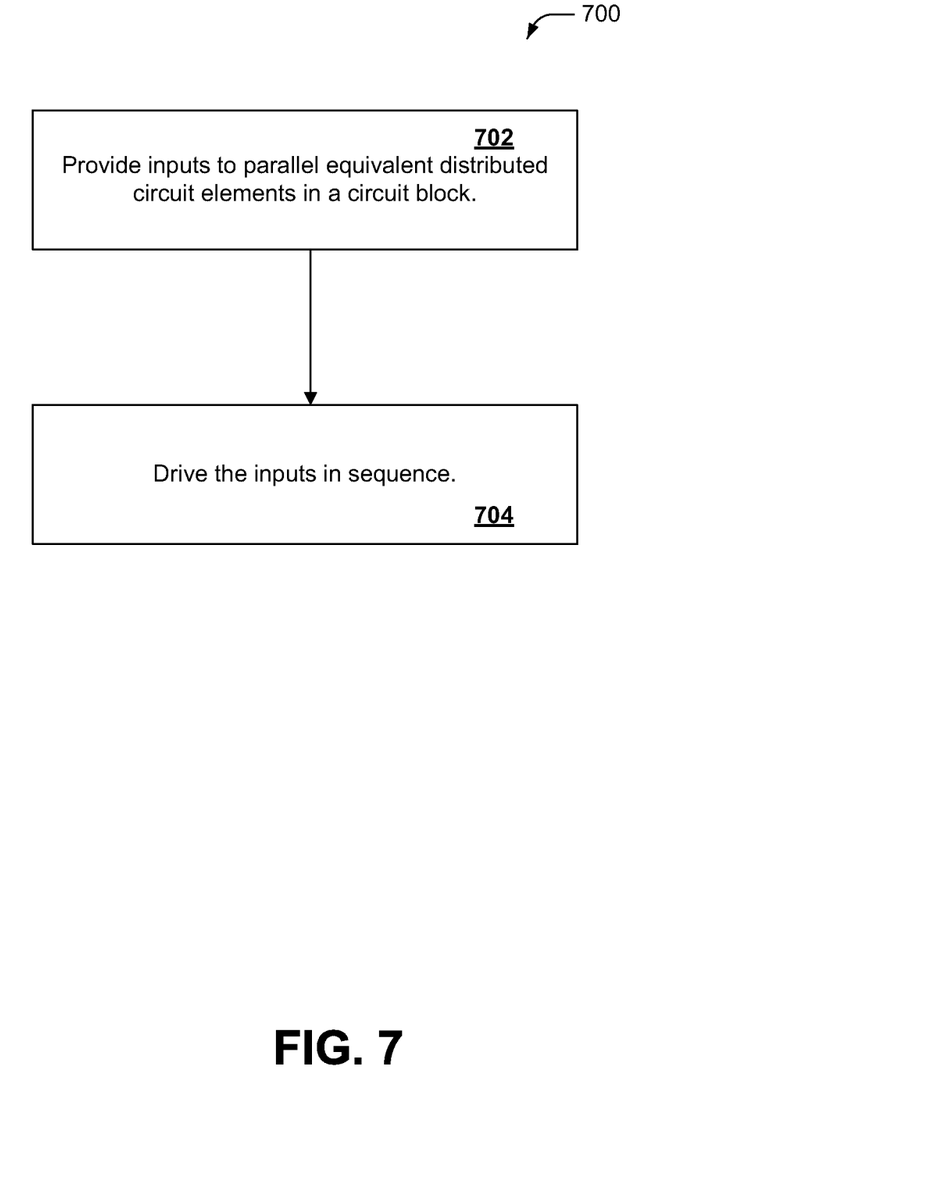
FIG. 7 is a process flow diagram illustrating a method for operating an analog loop filter, according to an embodiment of the subject disclosure.

Referring now to FIG. 7, illustrated is a process flow diagram of a method 700 for operating an analog loop filter, according to an embodiment of the subject disclosure. At element 702, inputs are provided to parallel equivalent distributed circuit elements in a circuit block. The circuit block can be part of an analog loop filter, such as a phase locked loop, a delay locked loop, or the like.

Any number of inputs greater than or equal to 2 can be provided to any number of parallel equivalent distributed circuit elements greater than or equal to 2. Each input described in element 802 corresponds to a single circuit element of the distributed equivalent circuit elements in the circuit block. At element 804, the inputs are each driven in sequence, one after the other. By sequentially activating the individual distributed equivalent circuit elements, qualities such as gain and noise can be decreased, while tuning range can be increased.

Figure 8:
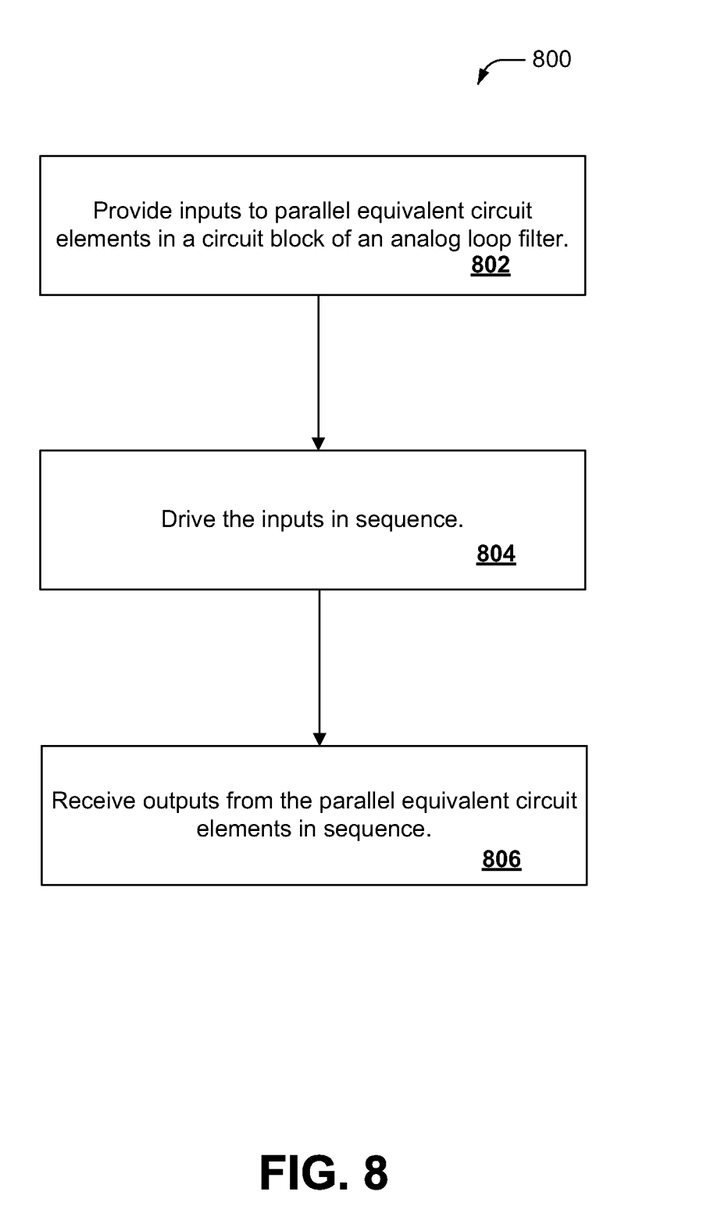
FIG. 8 is a process flow diagram illustrating a method for reducing noise in an analog loop filter, according to an embodiment of the subject disclosure.

Referring now to FIG. 8, illustrated is a process flow diagram for a method 800 for reducing noise in an analog loop filter, according to an embodiment of the subject disclosure. At element 802, inputs are provided to parallel equivalent circuit elements in a circuit block of an analog loop filter. The number of inputs corresponds to the number of parallel equivalent circuit elements. The number of parallel equivalent capacitors is greater than or equal to 2.

At element 804, the inputs are driven in sequence, one by one, through the corresponding input. The parallel circuit elements generate outputs in response to the sequential inputs. At element 806, sequentially produced outputs are received from the parallel equivalent circuit elements in sequence. The sequentially produced outputs correspond to the sequential activation of the parallel equivalent circuit elements.

Figure 9:
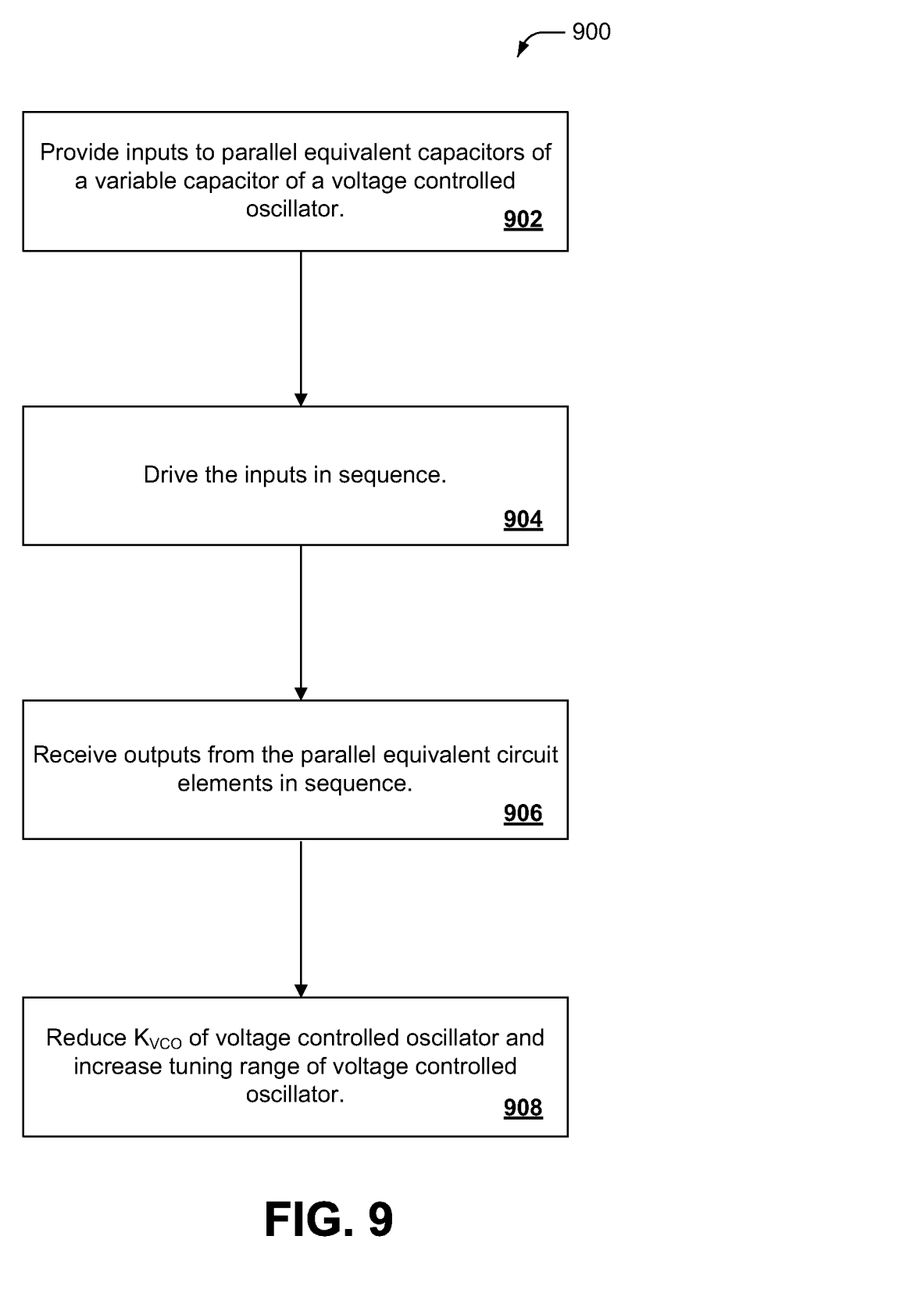
FIG. 9 is a process flow diagram illustrating a method for increasing the tuning range of a voltage controlled oscillator, according to an embodiment of the subject disclosure.

Referring now to FIG. 9, illustrated is a process flow diagram of a method 900 for increasing the tuning range of a voltage controlled oscillator, according to an embodiment of the subject disclosure. At element 902, inputs are provided to a variable capacitor made of parallel switched capacitors of a voltage controlled oscillator. The parallel equivalent capacitors can be, for example, distributed equivalent capacitors. The number of inputs corresponds to the number of parallel equivalent capacitors on a one-to-one basis. The number of parallel equivalent capacitors can be any number greater than or equal to 2.

At element 904, the inputs are driven in sequence so that each of the parallel equivalent capacitors are driven one after the other. Since the parallel equivalent capacitors are driven one after the other, at element 906, the parallel equivalent capacitors produce sequential outputs. Sequentially produced outputs refer to outputs in sequence, one after the other.

Since the parallel equivalent capacitors have a corresponding number of outputs (N), the voltage controlled oscillator has a tuning factor Kvco that is reduced by a factor of 1/N. The number of outputs (N) also increases the tuning range of the voltage controlled oscillator and reduces the total noise of the voltage controlled oscillator by a factor of 10 log(N) decibels. The multiple outputs also increase the quality factor (Q) for the voltage controlled oscillator.

Figure 10:
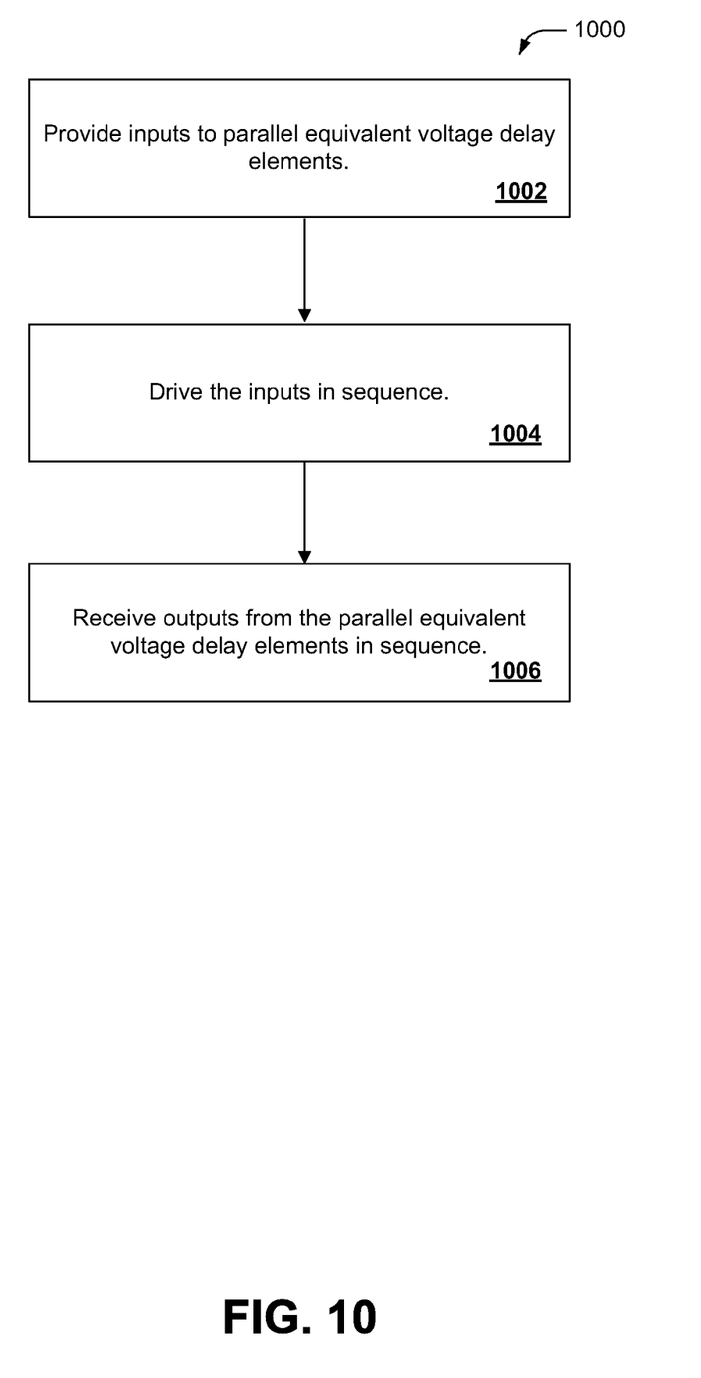
FIG. 10 is a process flow diagram illustrating a method for reducing gain in a delay locked loop circuit, according to an embodiment of the subject disclosure.

Referring now to FIG. 10, illustrated is a process flow diagram for a method 1100 for reducing gain in a delay locked loop circuit, according to an embodiment of the subject disclosure. At element 1002, a number of inputs are provided to a number of parallel equivalent voltage delay elements. The number of inputs can correspond to the number of voltage delay elements on a one-to-one basis and be any number greater than or equal to 2. At element 1004, the inputs are driven in sequence so that the voltage delay elements are driven in sequence so that the voltage delay elements generate an output in sequence. At element 1006, sequentially produced outputs are received from the parallel equivalent voltage delay elements. The sequentially produced outputs correspond to the voltage delay elements that are driven in sequence. Using the parallel equivalent voltage delay element can improve characteristics of the delay locked loop circuit, such as reducing gain and reducing overall noise.

The above description of illustrated embodiments, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In this regard, while the described subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. A method of tuning a voltage controlled oscillator (VCO), comprising:
providing a first switched capacitive circuit coupled between a first input of the VCO and a first output of the VCO;
providing a second switched capacitive circuit coupled between a second input of the VCO and a second output of the VCO;
adjusting capacitive loading of the first switched capacitive circuit over a first range by using a first analog control signal to control an impedance between a first capacitor coupled to the first input of the VCO and a second capacitor coupled to the first output of the VCO while capacitive loading of the second switched capacitive circuit remains at a minimum of a second range; and adjusting capacitive loading of the second switched capacitive circuit over the second range in response to a second analog control signal in sequence after the first range of the first switched capacitive circuit while capacitive loading of the first switched capacitive circuit remains at a maximum of the first range.

2. The method of claim 1, wherein providing the first switched capacitive circuit includes providing a first transistor including a first conduction terminal coupled to the first capacitor, a second conduction terminal coupled to the second capacitor, and a control terminal coupled for receiving a bias potential.

3. The method of claim 2, wherein providing the first switched capacitive circuit further includes:
    providing a second transistor including a first conduction terminal coupled to the first capacitor, a second conduction terminal coupled for receiving a power supply potential, and a control terminal coupled for receiving the bias potential; and
    providing a third transistor including a first conduction terminal coupled to the second capacitor, a second conduction terminal coupled for receiving the power supply potential, and a control terminal coupled for receiving the bias potential.

4. The method of claim 1, further including providing a plurality of switched capacitive circuits coupled between a plurality of inputs of the VCO and a plurality of outputs of the VCO, each switched capacitive circuit being responsive to a separate analog control signal.

5. The method of claim 4, further including reducing an equivalent proportionality constant (KVCO) of the VCO by a factor N equal to a number of the switched capacitive circuits.

6. A tuning circuit, comprising:
    a first varactor coupled between a first input of the tuning circuit and a first output of the tuning circuit; and
    a second varactor coupled between a second input of the tuning circuit and a second output of the tuning circuit, wherein a first control signal adjusts capacitive loading of the first varactor over a first range and a second control signal adjusts capacitive loading of the second varactor over a second range in sequence after the first range of the first varactor.

7. The tuning circuit of claim 6, wherein the first varactor includes:
    a first capacitor including a first terminal coupled to the first input of the tuning circuit;
    a first transistor including a first conduction terminal coupled to a second terminal of the first capacitor at a first node and a control terminal coupled for receiving a bias potential; and
    a second capacitor including a first terminal coupled to a second conduction terminal of the first transistor at a second node and a second terminal coupled to the first output of the tuning circuit.

8. The tuning circuit of claim 7, wherein the first varactor further includes:
    a second transistor including a first conduction terminal coupled to the first node, a second conduction terminal coupled for receiving a power supply potential, and a control terminal coupled for receiving the bias potential; and
    a third transistor including a first conduction terminal coupled to the second node, a second conduction terminal coupled for receiving the power supply potential, and a control terminal coupled for receiving the bias potential.

9. The tuning circuit of claim 6, wherein the first varactor includes a first switched capacitive circuit and the second varactor includes a second switched capacitive circuit.

10. The tuning circuit of claim 6, further including a plurality of varactors coupled between an input of the tuning circuit and an output of the tuning circuit, each varactor being responsive to a separate control signal to reduce an equivalent proportionality constant (KVCO) of the tuning circuit by a factor N equal to a number of the varactors.

11. A tuning circuit, comprising a plurality of variable capacitor circuits coupled between a plurality of inputs of the tuning circuit and a plurality of outputs of the tuning circuit, wherein a first control signal adjusts capacitive loading of a first variable capacitor circuit over a first range and a second control signal adjusts capacitive loading of a second variable capacitor circuit over a second range in sequence after the first range of the first variable capacitor circuit.

12. The tuning circuit of claim 11, wherein the first variable capacitor circuit includes:
    a first capacitor including a first terminal coupled to a first input of the tuning circuit;
    a first transistor including a first conduction terminal coupled to a second terminal of the first capacitor at a first node and a control terminal coupled for receiving a bias potential; and
    a second capacitor including a first terminal coupled to a second conduction terminal of the first transistor at a second node and a second terminal coupled to a first output of the tuning circuit.

13. The tuning circuit of claim 12, wherein the first variable capacitor circuit includes:
    a second transistor including a first conduction terminal coupled to the first node, a second conduction terminal coupled for receiving a power supply potential, and a control terminal coupled for receiving the bias potential; and
    a third transistor including a first conduction terminal coupled to the second node, a second conduction terminal coupled for receiving the power supply potential, and a control terminal coupled for receiving the bias potential.

14. A method of tuning a voltage controlled oscillator (VCO), comprising:
    providing a first switched capacitive circuit;
    providing a second switched capacitive circuit coupled in parallel with the first switched capacitive circuit;
    adjusting a capacitive loading of the first switched capacitive circuit over a first range in response to a first control signal; and
    adjusting a capacitive loading of the second switched capacitive circuit over a second range in response to a second control signal in sequence after the first range of the first switched capacitive circuit.

15. The method of claim 14, wherein providing the first switched capacitive circuit further includes:
    providing a first capacitor including a first terminal coupled to an input of the VCO;
    providing a first transistor including a first conduction terminal coupled to a second terminal of the first capacitor at a first node and a control terminal coupled for receiving a bias potential; and
    providing a second capacitor including a first terminal coupled to a second conduction terminal of the first transistor at a second node and a second terminal coupled to an output of the VCO.

16. The method of claim 15, wherein providing the first switched capacitive circuit further includes:

providing a second transistor including a first conduction terminal coupled to the first node, a second conduction terminal coupled for receiving a power supply potential, and a control terminal coupled for receiving the bias potential; and providing a third transistor including a first conduction terminal coupled to the second node, a second conduction terminal coupled for receiving the power supply potential, and a control terminal coupled for receiving the bias potential.

17. The method of claim 14, further including providing a plurality of switched capacitive circuits coupled between a plurality of inputs of the VCO and a plurality of outputs of the VCO, each switched capacitive circuit being responsive to a separate control signal.

18. The method of claim 17, further including reducing an equivalent proportionality constant (KVCO) of the VCO by a factor N equal to a number of the switched capacitive circuits.

19. A method of tuning a voltage controlled oscillator (VCO), comprising:

providing a variable capacitor coupled between an input of the VCO and an output of the VCO;

adjusting a first capacitive loading of the variable capacitor over a first range in response to a first control signal; and adjusting a second capacitive loading of the variable capacitor over a second range in response to a second control signal in sequence after the first range of the variable capacitor.

20. The method of claim 19, wherein providing the variable capacitor further includes:

providing a first capacitor including a first terminal coupled to the input of the VCO;

providing a first transistor including a first conduction terminal coupled to a second terminal of the first capacitor at a first node and a control terminal coupled for receiving a bias potential; and providing a second capacitor including a first terminal coupled to a second conduction terminal of the first transistor at a second node and a second terminal coupled to the output of the VCO.

21. The method of claim 20, wherein providing the variable capacitor further includes:

providing a second transistor including a first conduction terminal coupled to the first node, a second conduction terminal coupled for receiving a power supply potential, and a control terminal coupled for receiving the bias potential; and providing a third transistor including a first conduction terminal coupled to the second node, a second conduction terminal coupled for receiving the power supply potential, and a control terminal coupled for receiving the bias potential.

22. The method of claim 19, wherein providing the variable capacitor further includes providing a plurality of switched capacitive circuits coupled between a plurality of inputs of the VCO and a plurality of outputs of the VCO, each switched capacitive circuit being responsive to a separate control signal.

23. The method of claim 22, further including reducing an equivalent proportionality constant (KVCO) of the VCO by a factor N equal to a number of the switched capacitive circuits.

* * * * *